United States Patent
Feng et al.

(10) Patent No.: US 12,495,530 B2
(45) Date of Patent: Dec. 9, 2025

(54) VEHICLE DISPLAY DEVICE, METHOD FOR CONTROLLING SAME, AND VEHICLE

(71) Applicants: Chengdu BOE Optoelectronics Technology Co., Ltd., Sichuan (CN); BOE Technology Group Co., Ltd., Beijing (CN)

(72) Inventors: Binfeng Feng, Beijing (CN); Shangnan Jin, Beijing (CN); Shaoning Liu, Beijing (CN); Fei Li, Beijing (CN); Xuan Tao, Beijing (CN); Zhicai Xu, Beijing (CN); Bowen Xiao, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/275,022

(22) PCT Filed: Aug. 10, 2022

(86) PCT No.: PCT/CN2022/111337
§ 371 (c)(1),
(2) Date: Jul. 31, 2023

(87) PCT Pub. No.: WO2024/031409
PCT Pub. Date: Feb. 15, 2024

(65) Prior Publication Data
US 2025/0008709 A1     Jan. 2, 2025

(51) Int. Cl.
*H05K 5/00* (2025.01)
*H05K 7/20* (2006.01)
*G09F 21/04* (2006.01)

(52) U.S. Cl.
CPC ....... *H05K 7/20954* (2013.01); *H05K 5/0018* (2022.08); *G09F 21/049* (2020.05)

(58) Field of Classification Search
CPC . H05K 5/0017; H05K 5/0018; H05K 7/20954
(Continued)

(56) References Cited

U.S. PATENT DOCUMENTS

| | | | | |
|---|---|---|---|---|
| 6,163,359 A | * | 12/2000 | Smith | G02F 1/133602 349/161 |
| 2015/0362790 A1 | * | 12/2015 | Lv | H10H 20/80 349/61 |

(Continued)

FOREIGN PATENT DOCUMENTS

| | | |
|---|---|---|
| CN | 107195252 A | 9/2017 |
| CN | 107275378 A | 10/2017 |

(Continued)

*Primary Examiner* — Hung S. Bui
(74) *Attorney, Agent, or Firm* — XSENSUS LLP

(57) ABSTRACT

Provided is a vehicle display device. The vehicle display device includes: a display body and a heating structure; wherein the display body has a bending region and a non-bending region, and the heating structure is disposed on a back side of the display body and in the bending region, wherein a front side of the display body is configured for display, and the back side is opposite to the front side.

17 Claims, 15 Drawing Sheets

(58) Field of Classification Search
 USPC .................................... 361/807, 809, 810
 See application file for complete search history.

(56) References Cited

U.S. PATENT DOCUMENTS

| | | | |
|---|---|---|---|
| 2018/0170265 A1 | 6/2018 | Boehm | |
| 2021/0068314 A1* | 3/2021 | Chen | G06F 1/1652 |
| 2021/0292536 A1* | 9/2021 | Fujiwara | C08G 83/007 |
| 2021/0400852 A1* | 12/2021 | Kim | G06F 1/1641 |
| 2023/0042596 A1 | 2/2023 | Park | |

FOREIGN PATENT DOCUMENTS

| | | | |
|---|---|---|---|
| CN | 108376521 A | 8/2018 | |
| CN | 109118965 A | 1/2019 | |
| CN | 109922993 A | 6/2019 | |
| CN | 110473474 A | 11/2019 | |
| CN | 110556059 A | 12/2019 | |
| CN | 210852280 U | 6/2020 | |
| CN | 111554187 A | 8/2020 | |
| CN | 212322551 U | 1/2021 | |
| CN | 113039594 A | 6/2021 | |
| KR | 2013-0099664 A1 | 9/2013 | |
| KR | 20220069276 A * | 5/2022 | G09F 9/301 |
| WO | 2021/137336 A1 | 7/2021 | |

* cited by examiner

VEHICLE DISPLAY DEVICE, METHOD FOR CONTROLLING SAME, AND VEHICLE

CROSS-REFERENCE TO RELATED APPLICATION

This application is a U.S. national phase application based on PCT/CN2022/111337, filed on Aug. 10, 2022, the disclosure of which is incorporated herein by reference in its entirety

TECHNICAL FIELD

The present application related the field of display device, and in particular to a vehicle display device, a method for controlling the same, and a vehicle,

BACKGROUND

With the rapid development of the automotive industry, vehicle displays are developing rapidly. Currently, vehicle displays are not just simple monochrome displays, but are developing to full color, large size and diversity. Vehicle display devices can be used to display driving data, navigation maps, Internet information and audio-visual entertainment information, thus enhancing the user experience.

SUMMARY

Embodiments of the present disclosure provide a vehicle display device, a method for controlling the same, and a vehicle. The technical solution is described as follows.

According to some embodiments of the present disclosure, a vehicle display device is provided, including a display body and a heating structure, wherein the display body has a bending region and a non-bending region, and the heating structure is disposed on a back side of the display body and in the bending region, wherein a front side of the display body is configured for display, and the back side is opposite to the front side In some embodiments, the vehicle display device further includes: a temperature sensor disposed on the back side of the display body and in the non-bending region; wherein the temperature sensor (13) is configured to detect a temperature of the display body.

In some embodiments, the vehicle display device further includes a circuit board disposed on the back side of the display body and in the non-bending region; wherein the display body, the heating structure and the temperature sensor are electrically connected to the circuit board, and the circuit board is configured to control the heating structure to operate in response to the temperature of the display body being below a preset value.

In some embodiments, the display body has two bending regions, and the circuit board and the temperature sensor are disposed between the two bending regions.

In some embodiments, the display body includes a flexible display panel and a support plate; wherein the support plate is connected to one side of the flexible display panel, the heating structure is disposed on a side, distal from the flexible display panel, of the support plate, and the support plate has an etching region at least partially overlapped with the bending region.

In some embodiments, the bending region is within the etching region.

In some embodiments, one portion of the etching region is within the bending region, the other portion of the etching region is outside the bending region.

In some embodiments, in the etching region, an etching depth of the bending region is not less than an etching depth of the non-bending region.

In some embodiments, an etching depth of the non-bending region decreases in a direction away from the bending region.

In some embodiments, a minimum etching depth of the non-bending region is not less than one fifth of a thickness of the support panel.

In some embodiments, the display body further includes a touch layer disposed on a side, distal form the support plate, of the flexible display panel, or disposed within the flexible display panel.

According to some embodiments of the present disclosure, a method for controlling a vehicle display device is provided, applicable to the vehicle display device described above. The method includes:
  acquiring a temperature of the display body;
  controlling the heating structure to operate in response to the temperature of the display body being below a preset value.

According to some embodiments of the present disclosure, a vehicle is provided, including the vehicle display device as described above.

BRIEF DESCRIPTION OF DRAWINGS

In order to describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art can still derive other drawings from these accompanying drawings without creative efforts.

DETAILED DESCRIPTION

In order to make the objects, technical solutions and advantages of the present disclosure clearer, embodiments of the present disclosure are described in further detail below in conjunction with the accompanying drawings.

Unless separately defined, technical terms or scientific terms herein shall have the ordinary meaning as understood by persons having ordinary skill in the art to which this disclosure relates. The terms "first", "second", "third" and the like in the description of the application and the claims of the disclosure do not indicate any order, number or importance, but are used only to distinguish between the different components. Similarly, the words "one" or "a" and similar words do not indicate a quantitative limitation, but the existence of at least one. Similar words such as "includes" or "contains" are intended to indicate that the element or object appearing before "includes" or "contains" cover the elements or objects appearing after "includes" or "contains" and their equivalents, and do not exclude other elements or objects. Similar words such as "connected" or "linked" are not limited to physical or mechanical connections, but may include electrical connections, whether direct or indirect. The terms "up", "down", "left", "right", etc. are only used to indicate relative position relationships, and when the absolute position of the object being described is changed, the relative positional relationships described may also be changed accordingly.

Like mobile phones and other mobile terminals, bendable vehicle display devices are developed. Unlike mobile phones, vehicle display devices have a larger display region, and consequently, the vehicle display devices are prone to damages during the bending process.

Figure 1:
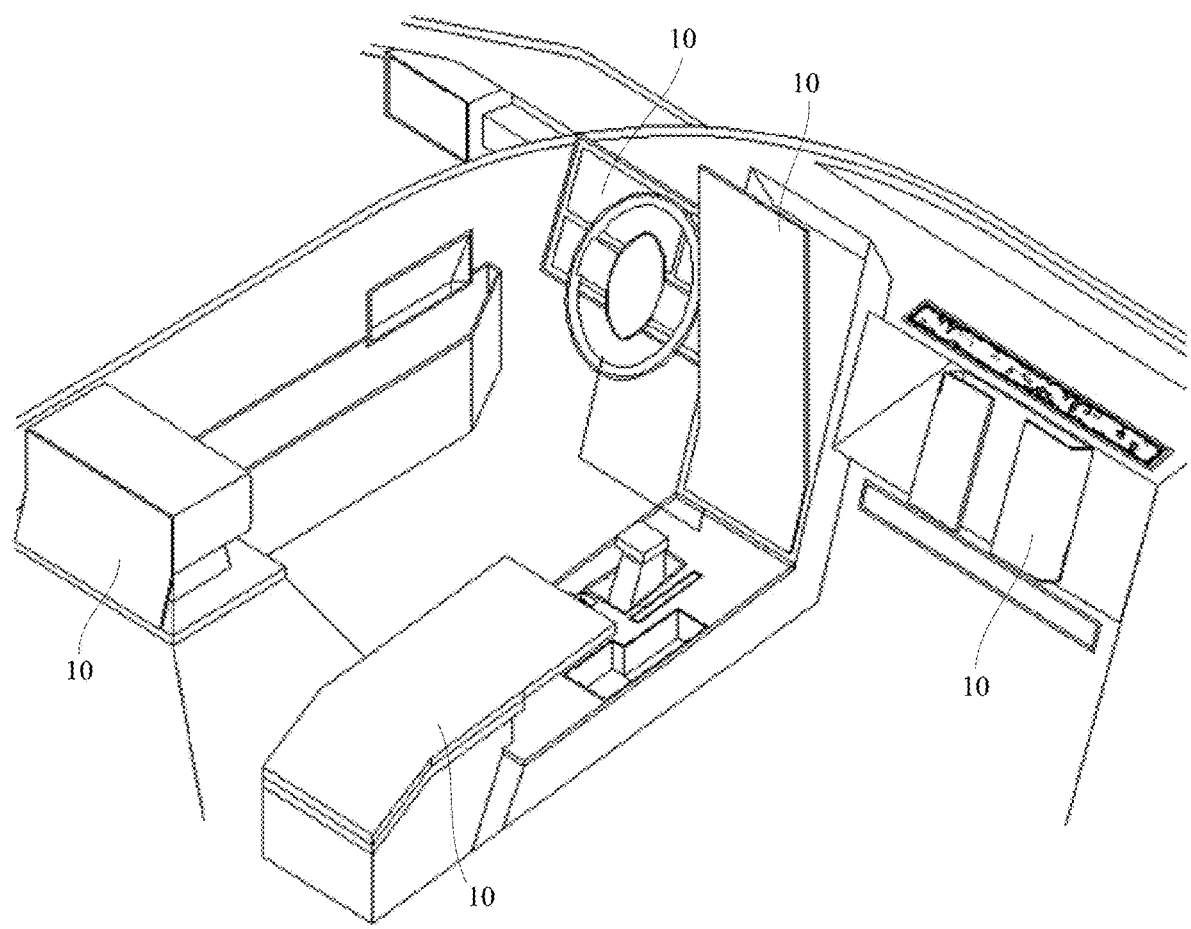
FIG. 1 is a partial schematic diagram of the interior of a vehicle according to some embodiments of the present disclosure.

FIG. 1 is a partial schematic diagram of the interior of a vehicle according to some embodiments of the present disclosure. A vehicle display device 10 is arranged in the vehicle. The quantity of vehicle display devices 10 arranged in the vehicle, the location of the arrangement, the manner of the arrangement and the like are different is different vehicles, and the illustration shown in FIG. 1 is only an example. As shown in FIG. 1, the vehicle display devices 10 are provided on the instrument panel in front of the driver's and passenger's seats, on the center console, behind the driver's headrest, and on the right side of the driver's seat. At least some of the vehicle display devices 10 are bendable, and the bend herein includes folding and coiling. For example, the vehicle display device 10 disposed at the instrument panel, at the center console and behind the driver's headrest are foldable, and the vehicle display device 10 disposed on the right side of the driver's seat is rollable.

In the case that the vehicle display device 10 is bent, a certain amount of stress is formed internally, and excessive stress results in damage to the vehicle display device 10. For a certain vehicle display device 10, there is a more suitable ambient temperature range in which the vehicle display device 10 is bent with less stress and less possibility of being damaged. In winter or cold regions, the temperature inside the car is low, and in the case that the vehicle display device 10 is bent by persons inside the vehicle, a larger stress is generated, which leads to damage to the vehicle display device 10.

Figure 2:
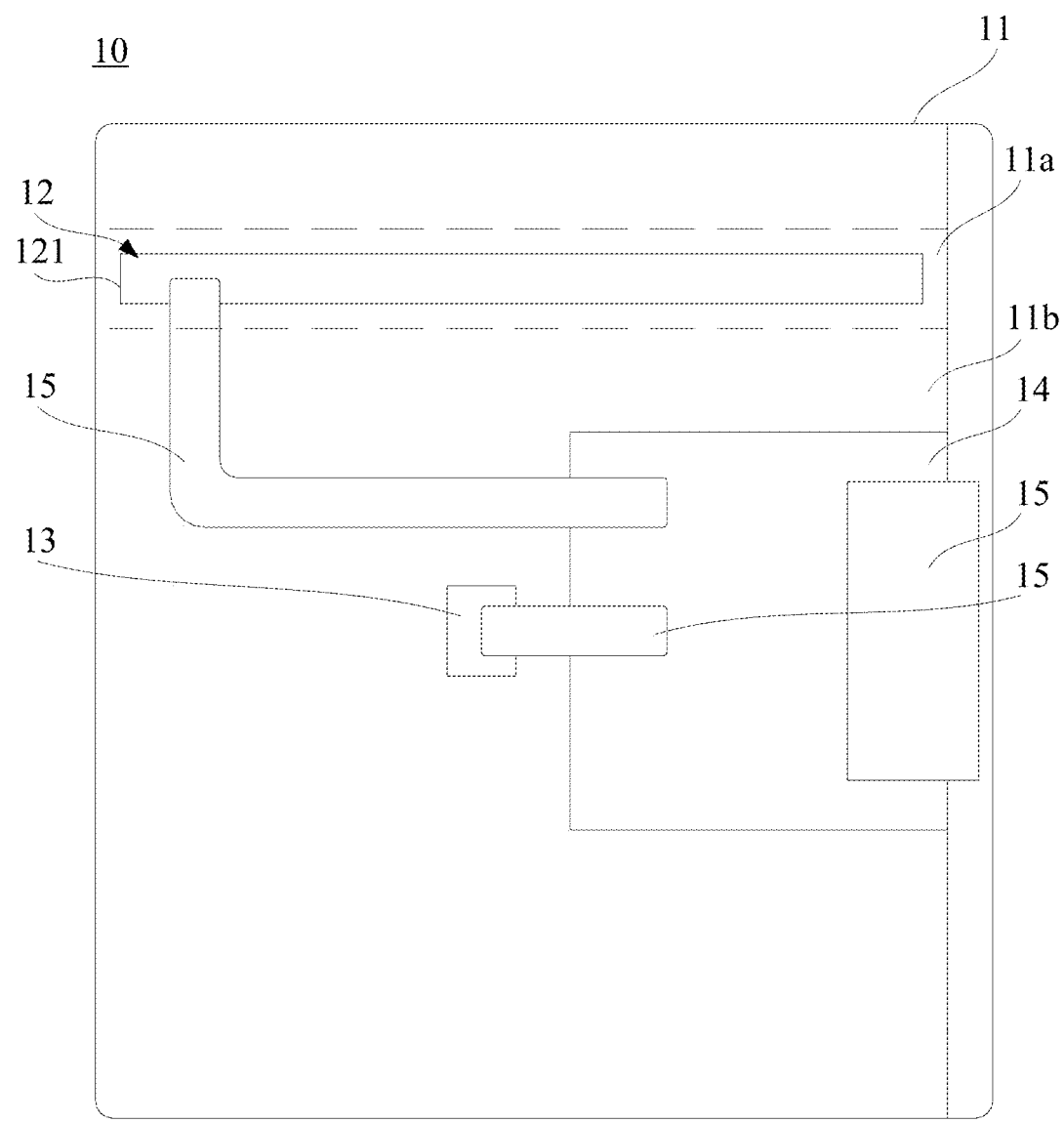
FIG. 2 is a schematic diagram of the structure of a vehicle display device according to some embodiments of the present disclosure.

FIG. 2 is a schematic diagram of the structure of a vehicle display device according to some embodiments of the present disclosure. As an embodiment, the vehicle display device is any one of the plurality of vehicle display devices shown in FIG. 1, for example, it is the vehicle display device disposed at the center console on the right side of the steering wheel. As shown in FIG. 2, the vehicle display device includes a display body 11 and a heating structure 12.

The display body 11 has a bending region 11a and a non-bending region 11b, and the non-bending region 11b is a region outside the bending region 11a. The bending region 11a is the region in which the display body 11 is curved in the case that the vehicle display device is bent, and the non-bending region 11b is the region in which the display body 11 is flat.

The display body 11 has a front side and a back side opposite to each other, and the front side is configured to display screen when the vehicle display device is operating. The heating structure 12 is disposed on the back side of the display body 11 and is within the bending region 11a.

By providing the heating structure 12 on the back side of the display body 11 of the vehicle display device, heating is performed by the heating structure 12 such that the bending region 11a of the display body 11 is at a more suitable temperature, reducing the possibility of the vehicle display device being damaged in bending process.

Taking the vehicle display device shown in FIG. 2 as an example, the vehicle display device is foldable and the display body 11 has a bending region 11a in which a heating structure 12 is arranged. As shown in FIG. 2, the vehicle display device further includes a temperature sensor 13, being disposed on the back of the display body 11 and in a non-bending region 11b of the display body 11. The temperature sensor 13 is configured to detect the temperature of the display body 11.

By providing a temperature sensor 13 on the back of the display body 11 to detect the temperature of the display body 11, it is convenient to control the temperature based on the detected temperature, such as whether to perform heating, the duration of heating, the temperature of heating, etc.

Disposing the temperature sensor 13 in the non-bending region 11b can avoid the temperature sensor 13 from affecting the bending of the display body 11, and can also avoid the display body 11 from damaging the temperature sensor 13 when it is bent. The temperature sensor 13 can be arranged close to the bending region 11a, such that the distance between the temperature sensor 13 and the bending region 11a is relatively short, and the temperature detected by the temperature sensor 13 can more accurately reflect the temperature of the bending region 11a.

Exemplarily, the temperature sensor 13 is a thermistor, the resistance value of the thermistor varies with the temperature, and the temperature is determined based on the resistance value of the thermistor.

As shown in FIG. 2, the heating structure 12 includes a heating sheet 121 in a shape of a strip extending from one end to the other end of the bending region 11a. The heating sheet 121 is flexible and is able to bend with the display body 11.

In other examples, the heating structure 12 includes a plurality of heating sheets 121 spaced from each other. For a bending region 11a of large size, the heating region is small and produces a limited effect, and the heating region is increased by arranging a plurality of heating sheets 121. The plurality of heating sheets 121 are spaced from each other, compared with a single larger area heating sheet 121 having the same area, and the spacing between adjacent heating sheets 121 can reduce the effect of the heating structure 12 on the bending performance of the display body 11.

As shown in FIG. 2, the vehicle display device further includes a circuit board 14. The circuit board 14 is disposed on the back side of the display body 11 and in the non-bending region 11b. The display body 11, the heating structure 12, and the temperature sensor 13 are electrically connected to the circuit board 14. The circuit board 14 is configured to control the heating structure 12 to operate in response to the temperature of the display body 11 being below a preset value.

The circuit board 14 is arranged in the non-bending region 11b, such that the circuit board 14 does not affect the bending of the display body 11. The display body 11, the heating structure 12 and the temperature sensor 13 are all connected to the circuit board 14 and are controlled by the circuit board 14, reducing the quantity of circuit boards 14 in the on-board display device.

The circuit board 14 controls the heating structure 12 based on the temperature detected by the temperature sensor 13, such that the heating structure 12 is properly heated. In the case that the temperature sensor 13 detects a temperature lower than a preset value, the circuit board 14 controls the heating structure 12 to work to avoid the temperature of the display body 11 being too low. For different vehicle display devices, the preset values are the same or different. The preset value is determined through tests. The display body 11 bending at different temperatures has different stress distributions, and the possibility of damage to the display body 11 is assessed based on the stress distribution. As the temperature decreases, the stress distribution gradually deteriorates, leading to a gradually increasing possibility of damage to the display body 11. The temperature corresponding to the stress distribution making the possibility of damage to the display body 11 at or above an unacceptable level is determined as a preset value. For example, 15° C., 18° C., 20° C., etc.

Exemplarily, the circuit board 14 is provided with a microcontroller unit (MCU) and a circuit structure, and the circuit structure includes, for example, an analog-to-digital converter. In the case that the temperature sensor 13 is a thermistor, for example, the MCU acquires the resistance value of the thermistor through the circuit structure, determines the temperature of the display body 11 based on the resistance value, and then controls the heating structure 12 based on the temperature. For example, PID regulating is used to control the temperature of the bending region 11a within the set range.

As shown in FIG. 2, the heating structure 12 and the circuit board 14 are connected to each other via a flexible circuit board 15, and the temperature sensor 13 and the circuit board 14 are connected to each other via a flexible circuit board 15. In other examples, the flexible circuit board 15 connecting the heating structure 12 and the circuit board 14 and the flexible circuit board 15 connecting the temperature sensor 13 and the circuit board 14 are one flexible circuit board, i.e., the temperature sensor 13, the heating structure 12, and the circuit board 14 are connected by one flexible circuit board 15.

Figure 3:
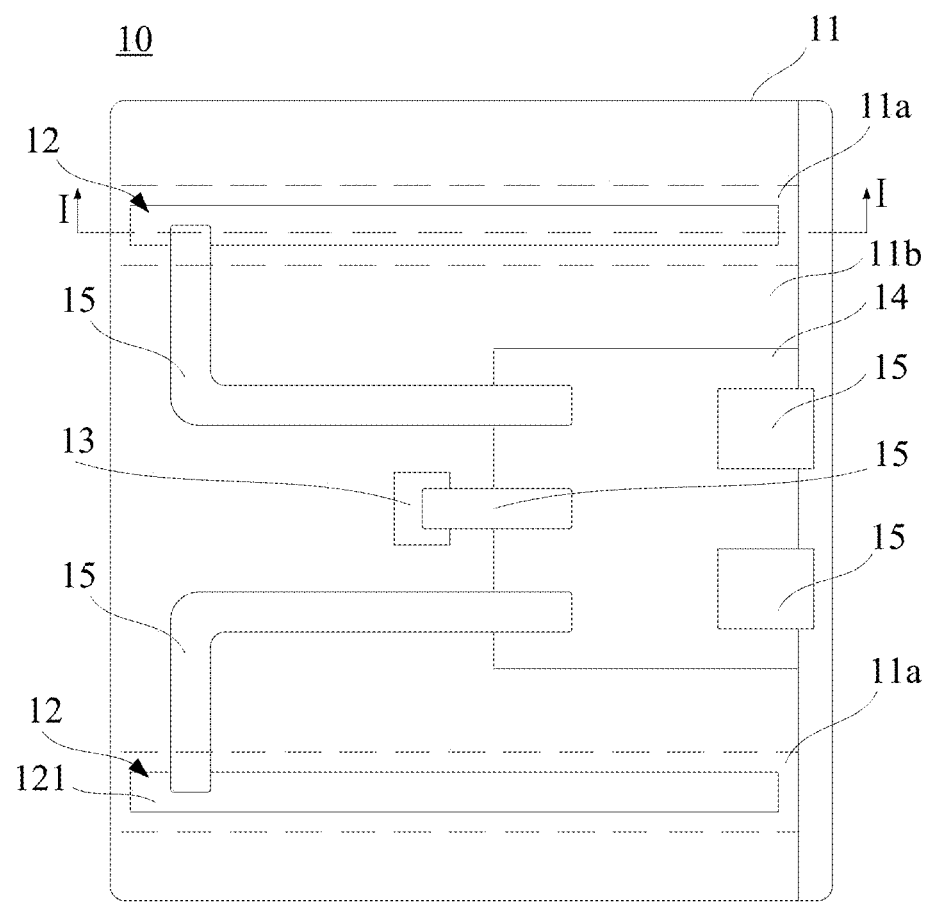
FIG. 3 is a schematic diagram of a structure of a vehicle display device according to some embodiments of the present disclosure.

FIG. 3 is a schematic diagram of a structure of a vehicle display device according to some embodiments of the present disclosure. The vehicle display device is the vehicle display device 10 arranged on the instrument panel in front of the passenger side in FIG. 1. As shown in FIG. 3, the display body 11 in the vehicle display device has two bending regions 11a, such that two regions of the vehicle display device can be bent. The circuit board 14 and the temperature sensor 13 are disposed between the two bending regions 11a.

In the vehicle display device, the region between the two bending regions 11a of the display body 11 is the non-bending region 11b. The circuit board 14 is arranged between the two bending regions 11a, such that the distance from the circuit board 14 to both bending regions 11a is shorter, and it is convenient to connect to the two heating structures 12 in the two bending regions 11a through one circuit board 14. The temperature sensor 13 is arranged between the two bending regions 11a, such that the distance from the temperature sensor 13 to both bending regions 11a is shorter, and the temperature detected by the temperature sensor 13 can be determined as the temperature of the two bending regions 11a, enabling the two bending regions 11a to share a temperature sensor 13 to reduce costs.

Optionally, the temperature sensor 13 is centered between the two bending regions 11a, i.e., the distances between the temperature sensor 13 and the two bending regions 11a are identical, allowing the temperature detected by the temperature sensor 13 to more accurately reflect the temperature of the two bending regions 11a.

Figure 4:
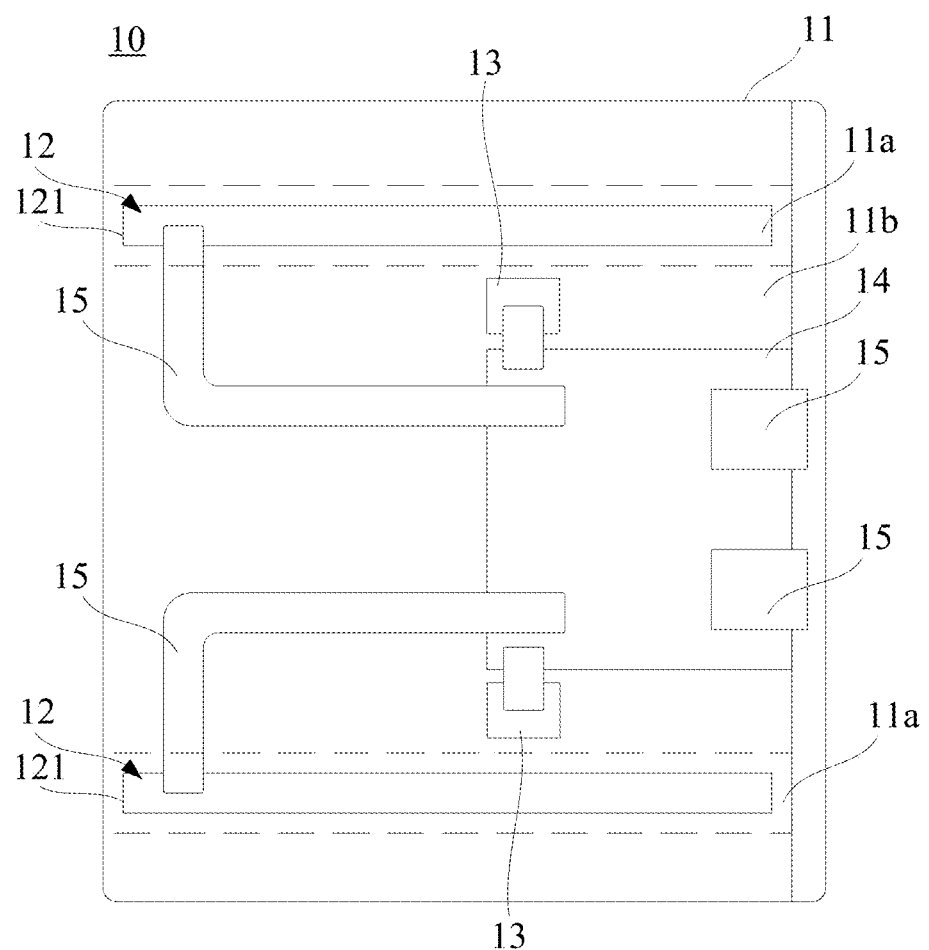
FIG. 4 is a schematic diagram of the structure of a vehicle display device according to some embodiments of the present disclosure.

In other embodiments, as shown in FIG. 4, the vehicle display device includes two temperature sensors 13, both of which are disposed between two bending regions 11a to facilitate sharing one circuit board 14. One of the temperature sensors 13 is disposed close to one bending region 11a and the other temperature sensor 13 is disposed close to the other bending region 11a. For a larger sized vehicle display device, the distance between the two bending regions 11a is long and the temperatures may be significant different. By providing two temperature sensors 13 to detect the temperatures of the two bending regions 11a separately, it is possible to make the detected temperature more accurate. Because the temperatures are measured separately by the two temperature sensors 13, the circuit board 14 can control one of the two heating structures 12 to work to heat one of the bending regions 11a or control the two heating structures 12 to work to heat the two bending regions 11a based on the temperature measured by the two temperature sensors 13.

Optionally, the display body 11 has three or more bending regions 11a. Each of the bending regions 11a is arranged with a heating structure 12. The vehicle display device includes a circuit board 14 disposed in a non-bending region 11b, to which each of the heating structures 12 is connected via a flexible circuit board. The vehicle display device further includes a plurality of circuit boards 14, each of the circuit boards 14 is disposed in the non-bending region 11b.

For example, the display body 11 has three bending region 11a, the vehicle display device includes two circuit boards 14, three bending region 11a and two circuit boards 14 are arranged alternately, each of the heating structures 12 is connected to the nearest circuit board 14 via the flexible circuit board.

Figure 5:
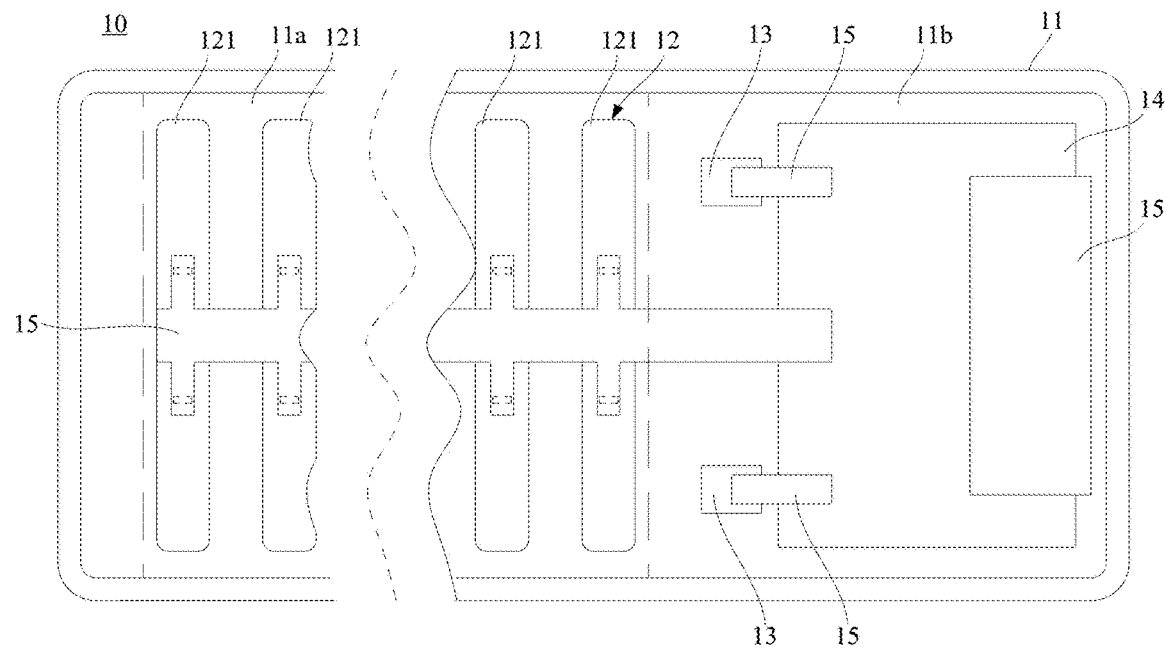
FIG. 5 is a schematic diagram of a structure of a vehicle display device according to some embodiments of the present disclosure.

FIG. 5 is a schematic diagram of the structure of a vehicle display device according to some embodiments of the present disclosure. The vehicle display device is a vehicle display device 10 arranged on the right side of the driver's seat in FIG. 1, and the vehicle display device 10 is rollable. As shown in FIG. 5, the display body 11 of the vehicle display device has a bending region 11a. For the vehicle display devices with the same display area shown in FIGS. 2 to 4 and the vehicle display device shown in FIG. 5, the area of the bending region 11a is larger in the vehicle display device shown in FIG. 5 in order to realize coiling. The heating structure 12 includes a plurality of heating sheets 121, and the plurality of heating sheets 121 are sequentially spaced in the bending region 11a.

The circuit board 14 is disposed on one side of the bending region 11a, and the plurality of heating sheets 121 are connected to the circuit board 14 by one flexible circuit board 15. The flexible circuit board 15 is connected to the middle of the heating pad 121.

The vehicle display device includes two temperature sensors 13, the two temperature sensors 13 are disposed on either side of the flexible circuit board 15 connected to the heating structure 12. Because the display body 11 is cable of rolling, the area of the bending region 11a is usually large, and the temperature detected by the temperature sensor 13 in the non-bending region 11b differs from the actual temperature at different positions in the bending region 11a. By arranging two temperature sensors 13 to detect the temperature of the display body 11 at different positions, the heating structure 12 is controlled to work based on the temperature detected by the two temperature sensors 13. For example, controlling the heating structure 12 to work based on the lower of the two temperatures detected by the two temperature sensors 13, reducing the risk of damage to the vehicle display device during bending process.

Figure 6:
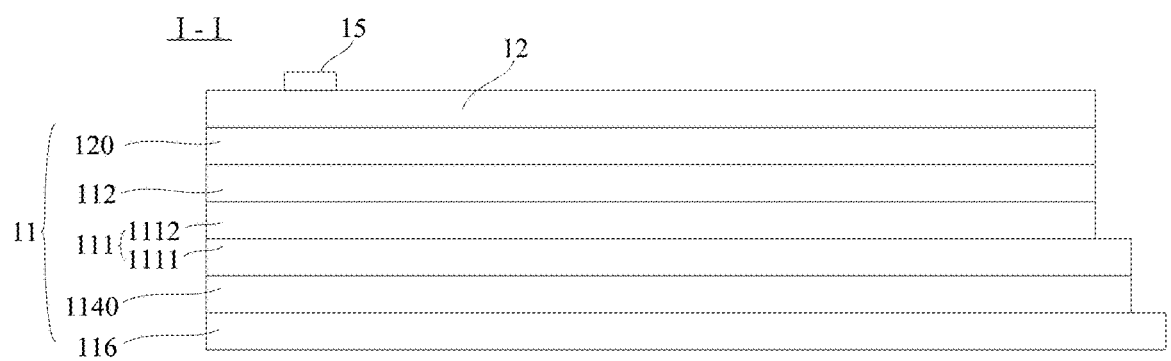
FIG. 6 is a cross-sectional diagram of FIG. 3 at I-I.

FIG. 6 a cross-sectional diagram of FIG. 3 at I-I. As shown in FIG. 6, in the vehicle display device, the display body 11 includes a flexible display panel 111 and a support plate 112, the support plate 112 is connected to one side of the flexible display panel 111, and the heating structure 12 is disposed on a side, distal from the flexible display panel 111, of the support plate 112.

The side, distal from the support plate 112, of the flexible display panel 111 is configured for display, and the support plate 112 is configured to provide support for the flexible display panel 111.

The support plate 112 is a metal member having good toughness and structural strength, such as stainless steel. In addition, the metal also has good thermal conductivity, which can reduce the temperature difference between different regions of the flexible display panel 111, such that the temperature detected by the temperature sensor 13 is closer to the temperature of the bending region 11a, and also facilitates the conduction of heat generated by the heating structure 12 to the flexible display panel 111.

The display body 11 further includes a functional layer 1140 and a cover plate 116, the functional layer 1140 is disposed on a side, distal from the support plate 112, of the flexible display panel 111 and the cover plate 116 is disposed on a side, distal from the flexible display panel 111, of the functional layer 1140. The cover plate 116 is used for protection.

The heating structure 12 is bonded to the support plate 112 by a thermally conductive adhesive 120 to improve thermal conductivity. The temperature sensor 13 is bonded to the support plate 112 via the thermally conductive adhesive 120.

Figure 7:
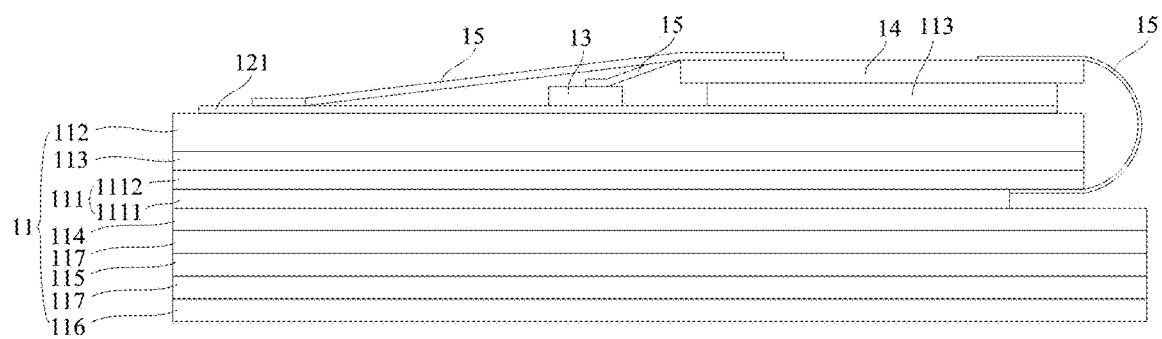
FIG. 7 is a side diagram of a vehicle display device according to some embodiments of the present disclosure.

FIG. 7 is a side diagram of a vehicle display device according to some embodiments of the present disclosure. The vehicle display device is a side diagram of the vehicle display device shown in FIG. 3. As shown in FIG. 7, the circuit board 14, the temperature sensor 13, and the heating structure 12 are bonded to the support plate 112. For example, the circuit board 14 is bonded to the support plate 112 by double-sided adhesive 113.

As an example, as shown in FIG. 7, the flexible display panel 111 includes an OLED display layer 1111 and a back film layer 1112. The back film layer 1112 is bonded to the support plate 112 by, for example, a double-sided adhesive layer 113. The backing film layer 1112 can provide support and protection, and also has good thermal conductivity, which facilitates heat dissipation of the OLED display layer 1111. The OLED display layer 1111 is connected to the circuit board 14 via the flexible circuit board 15.

As shown in FIG. 7, the functional layer 1140 includes a polarizer 114 and a touch layer 115. The polarizer 114 is disposed on a side, distal from the support plate 112, of the flexible display panel 111. The touch layer 115 is disposed on the side, distal from the flexible display panel 111, of the polarizer 114, and the cover plate 116 is disposed on the side, distal from the polarizer 114, of the touch layer 115. The cover plate 116 is bonded to the touch layer 115 by an optical adhesive layer 117, and the touch layer 115 is bonded to the polarizer 114 by the optical adhesive layer 117.

The cover plate 116 is used to provide protection, and the touch layer 115 enables the display body 11 to perform touch functions.

In a vehicle display device, the display region is usually large, and by providing a separate touch layer 115, i.e., the touch layer 115 is provided outside the flexible display panel 111, it is beneficial to reduce the process difficulty and improve the yield rate.

Figure 8:
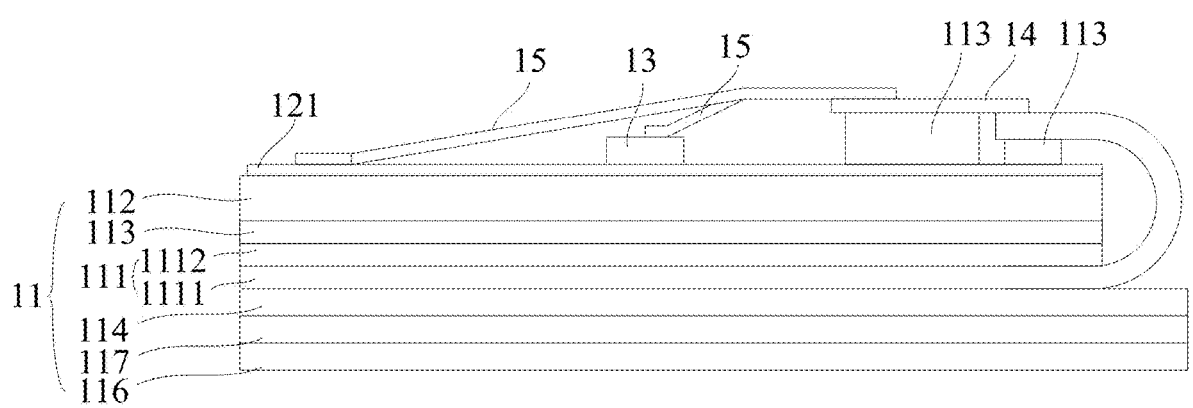
FIG. 8 is a side diagram of a vehicle display device according to some embodiments of the present disclosure.

FIG. 8 is a side diagram of a vehicle display device according to some embodiments of the present disclosure. The structure of the display body 11 shown in FIG. 8 is slightly different from that of the display body 11 shown in FIG. 7. As shown in FIG. 8, the flexible display panel 111 in the embodiment is a touch flexible display panel with a touch function, i.e., the touch layer is provided within the flexible display panel 111, for example, within the OLED display layer 1111, which is beneficial to further reducing the thickness of the display body 11.

In the flexible display panel 111, a portion of the OLED display layer 1111 is bent to the back side of the support plate 112, that is, the side, distal from the cover plate 116, of the support plate 112, and connected to the circuit board 14. The portion of the OLED display layer 1111 bent to the back side of the support plate 112 is bonded to the support plate 112 by, for example, double-sided adhesive.

The circuit board 14 is bonded to the support board 112 by double-sided adhesive, and the portion of the OLED display layer 1111 bent to the back of the support board 112 is disposed on the side, close to the support board 112, of the circuit board 14.

Figure 9:
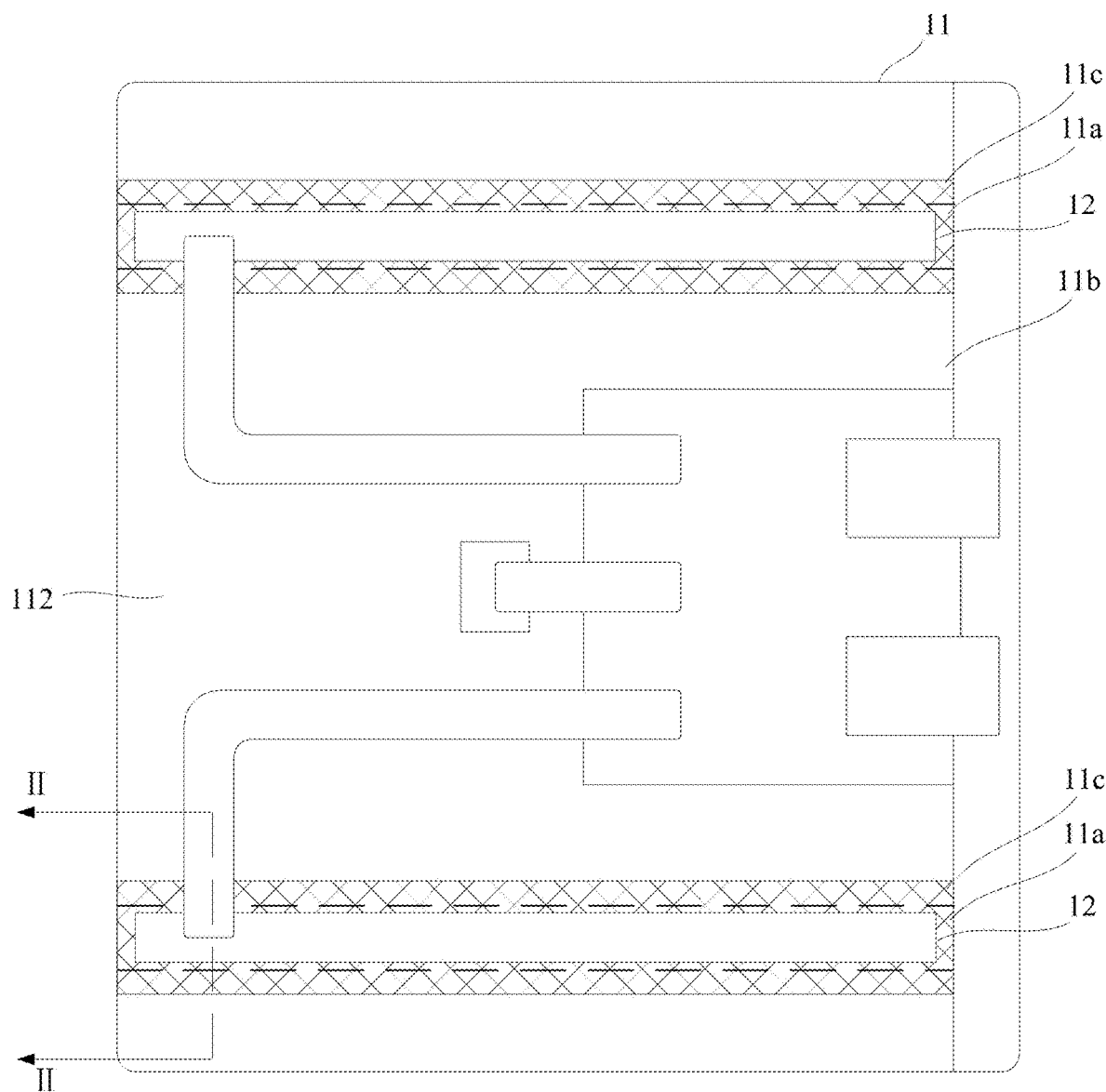
FIG. 9 is a schematic diagram of the structure of a vehicle display device according to some embodiments of the present disclosure.

FIG. 9 is a schematic diagram of the structure of a vehicle display device according to some embodiments of the present disclosure. As shown in FIG. 9, the support plate 112 has an etching region 11c, and the etching region is illustrated in FIG. 9 as filling. The etching region 11c is at least partially overlapped with the bending region 11a.

An etching pattern is formed in the etching region 11c. By providing the etching region 11c on the support plate 112, the stiffness of the support plate 112 is partially reduced, making the support plate 112 more susceptible to bending.

Figure 10:
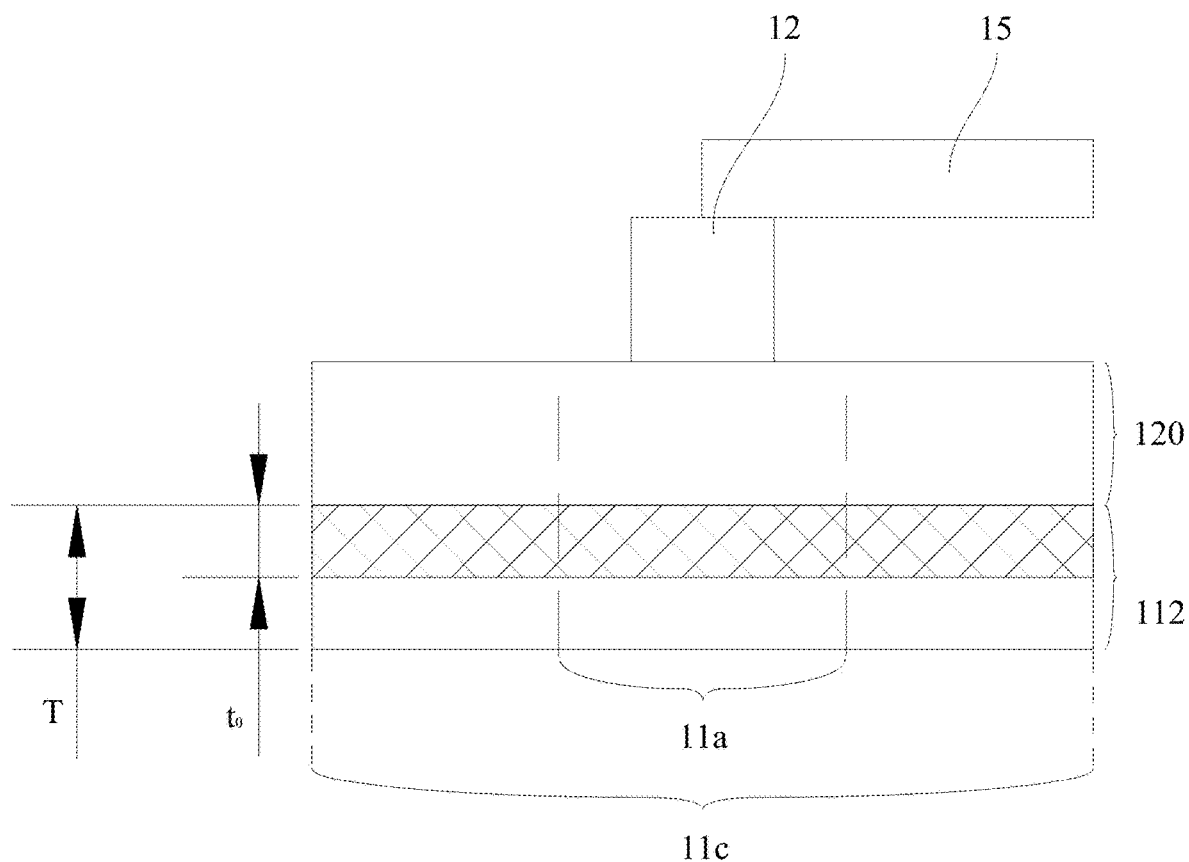
FIG. 10 is a cross-sectional diagram of a vehicle display device according to some embodiments of the present disclosure.

FIG. 10 is a cross-sectional diagram of a vehicle display device according to some embodiments of the present disclosure. The cross-section corresponds to the II-II cross-section in FIG. 9. As shown in FIG. 10, the bending region 11a is within the etching region 11c. That is, an etching pattern is formed throughout the bending region 11a, and an etching pattern is also formed in the non-bending region 11b immediately adjacent to the bending region 11a, and the area of the etching region 11c is larger than the area of the bending region 11a.

The etching pattern is formed throughout the bending region 11a to reduce the stiffness of the bending region 11a and to make the bending region 11a easy to bend. The area of the etching region 11c is larger than the area of the bending region 11a, which reduces the local stress within the support plate 112 during bending process.

The etching pattern includes a plurality of holes, which are through holes, i.e., through the support plate 112, or blind holes, i.e., not through the support plate 112. The depth of the holes is the etching depth t0, and an etching depth to equal t0 the thickness T of the support plate 112 indicates that the holes are through holes, and an etching depth t0 less than the thickness T of the support plate 112 indicates that the holes are blind holes. The depth of etching is illustrated by the filling range in FIG. 10.

Figure 11:
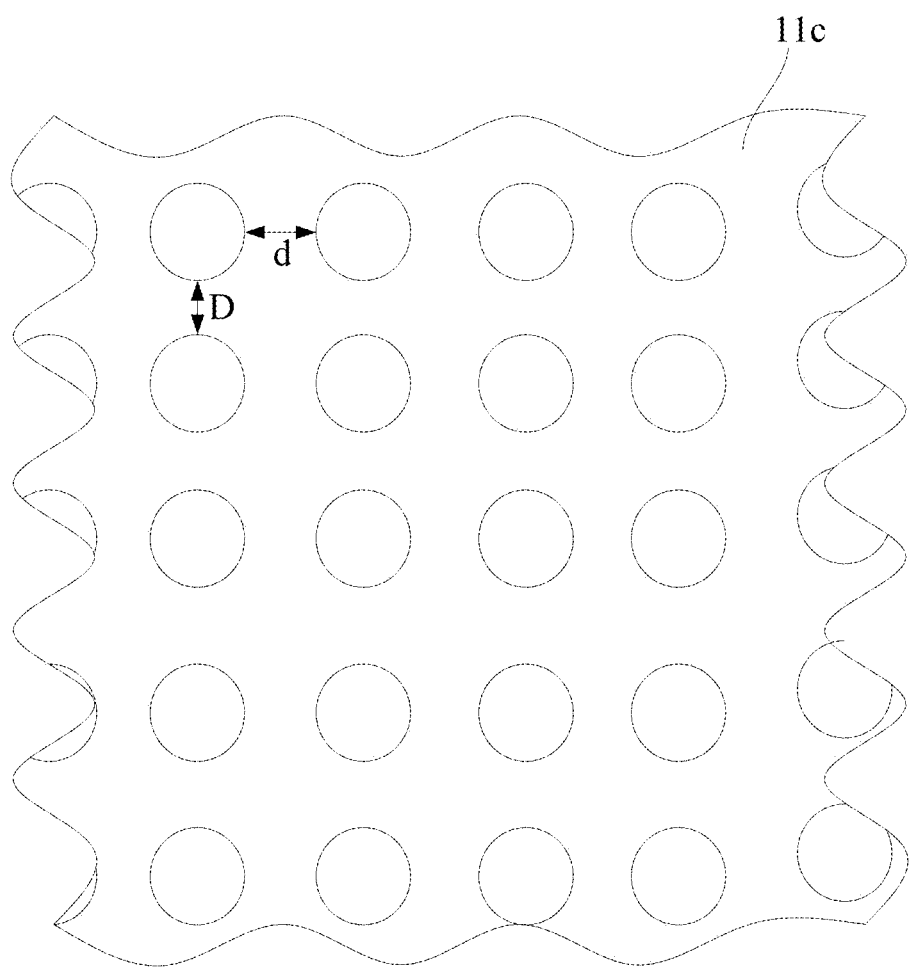
FIG. 11 is a schematic diagram of an etching graphic according to some embodiments of the present disclosure.

FIG. 11 is a schematic diagram of an etching graphic according to some embodiments of the present disclosure. As shown in FIG. 11, the etching pattern includes a plurality of circular holes, and the diameters of different circular holes are the same or different. The plurality of holes are arranged in a plurality of rows and columns. The minimum spacing d between adjacent circular holes in one row is not less than 0.2 mm, and the minimum spacing D between adjacent circular holes in one column is not less than 0.2 mm. The spacing of the circular holes in one row and the spacing of the circular holes in the same column are the same or different.

Figure 12:
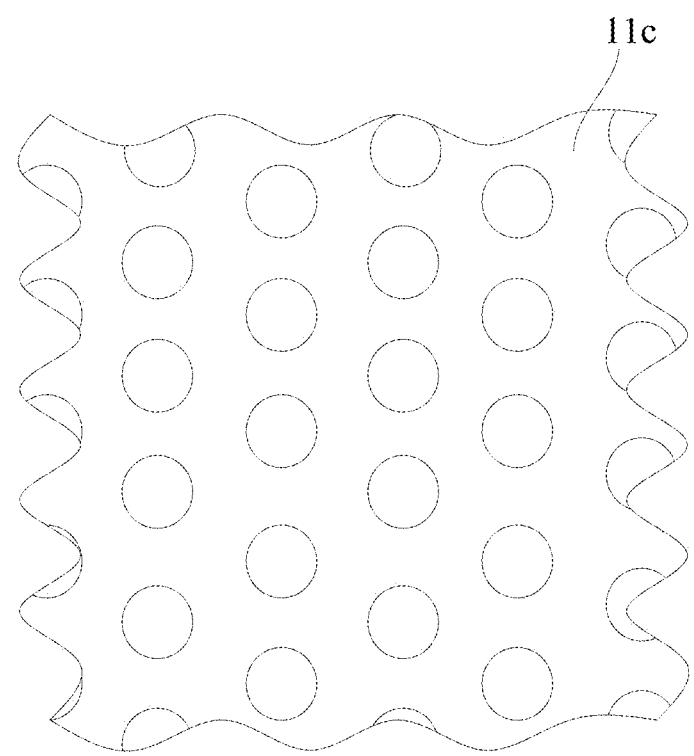
FIG. 12 is a schematic diagram of an etching graphic according to some embodiments of the present disclosure.

The circular holes in adjacent rows are staggered, as shown in FIG. 12, for example.

Figure 13:
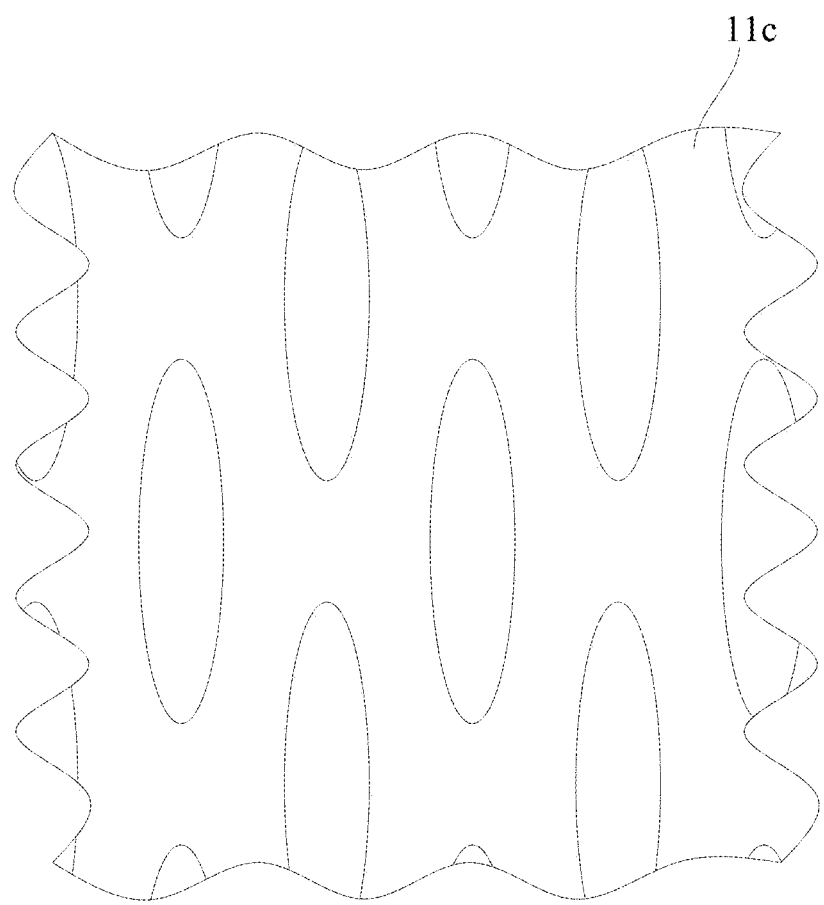
FIG. 13 is a schematic diagram of an etching graphic according to some embodiments of the present disclosure.

FIG. 13 is a schematic diagram of an etching graphic according to some embodiments of the present disclosure. As shown in FIG. 13, the etching pattern includes a plurality of elliptical holes, the plurality of elliptical holes are arranged in a plurality of rows and columns, and the elliptical holes in adjacent rows are staggered.

The long axis of the elliptical hole is oriented parallel to the bend line of the support plate 112 or at an acute angle, such as an acute angle of not more than 45°.

Within the etching region 11c, the etching depths are the same at different positions. For example, in the embodiment shown in FIG. 10, the etching depths in the etching region 11c are the same as the bending region 11a and the non-bending region 11b. Because the etching depths are the same at each of the positions, the process is simpler when processing the support plate 112.

In the example, the etching depth to in the etching region 11c is less than the thickness T of the support plate 112, such as 0.2≤ t0<T.

Figure 14:
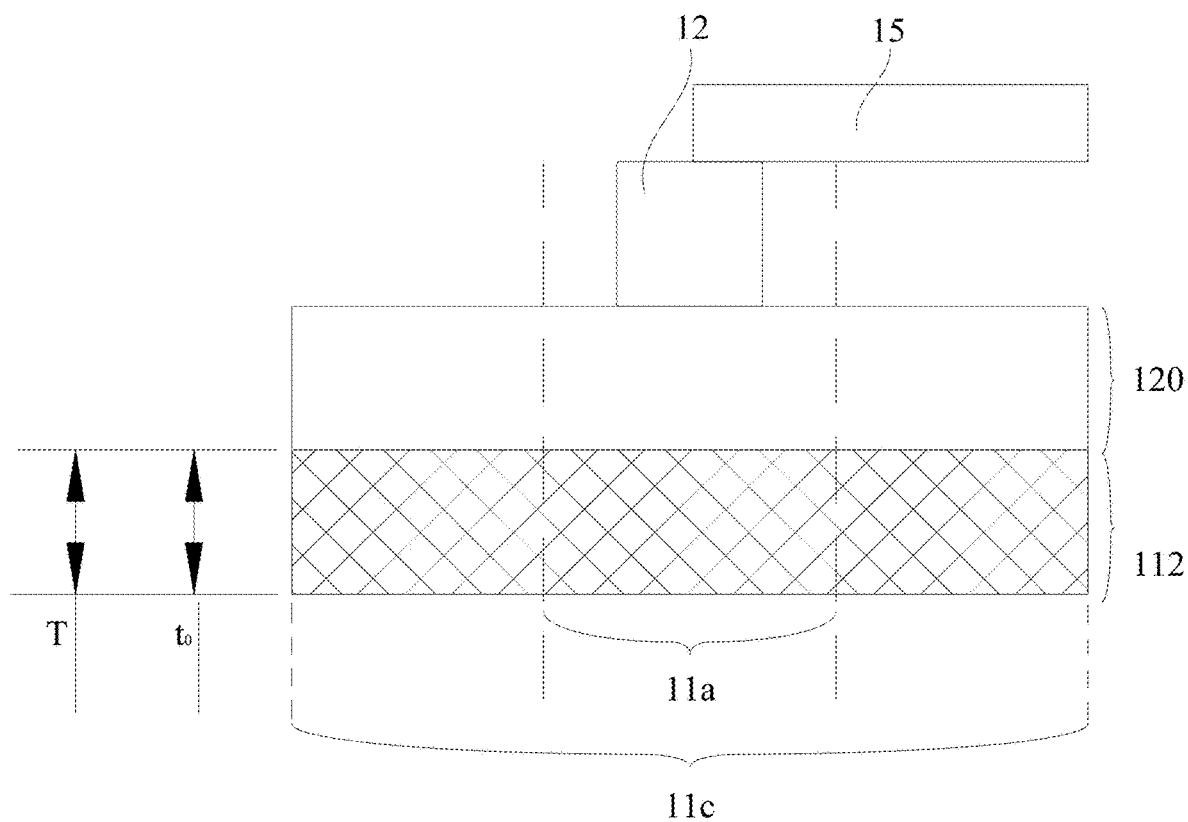
FIG. 14 is a schematic diagram of a partial cross-section of a vehicle display device according to embodiments of the present disclosure.

FIG. 14 is a schematic diagram of a partial cross-section of a vehicle display device according to embodiments of the present disclosure. The cross-section corresponds to the II-II cross-section in FIG. 9. As shown in FIG. 14, in the embodiment, the etching depth to of the etching region 11c is equal to the thickness T of the support plate 112.

In other embodiments, the etching depth varies at different positions within the etching region 11c. For example, within the etching region 11c, the etching depth in the bending region 11a is greater than the etching depth in the non-bending region 11b.

Figure 15:
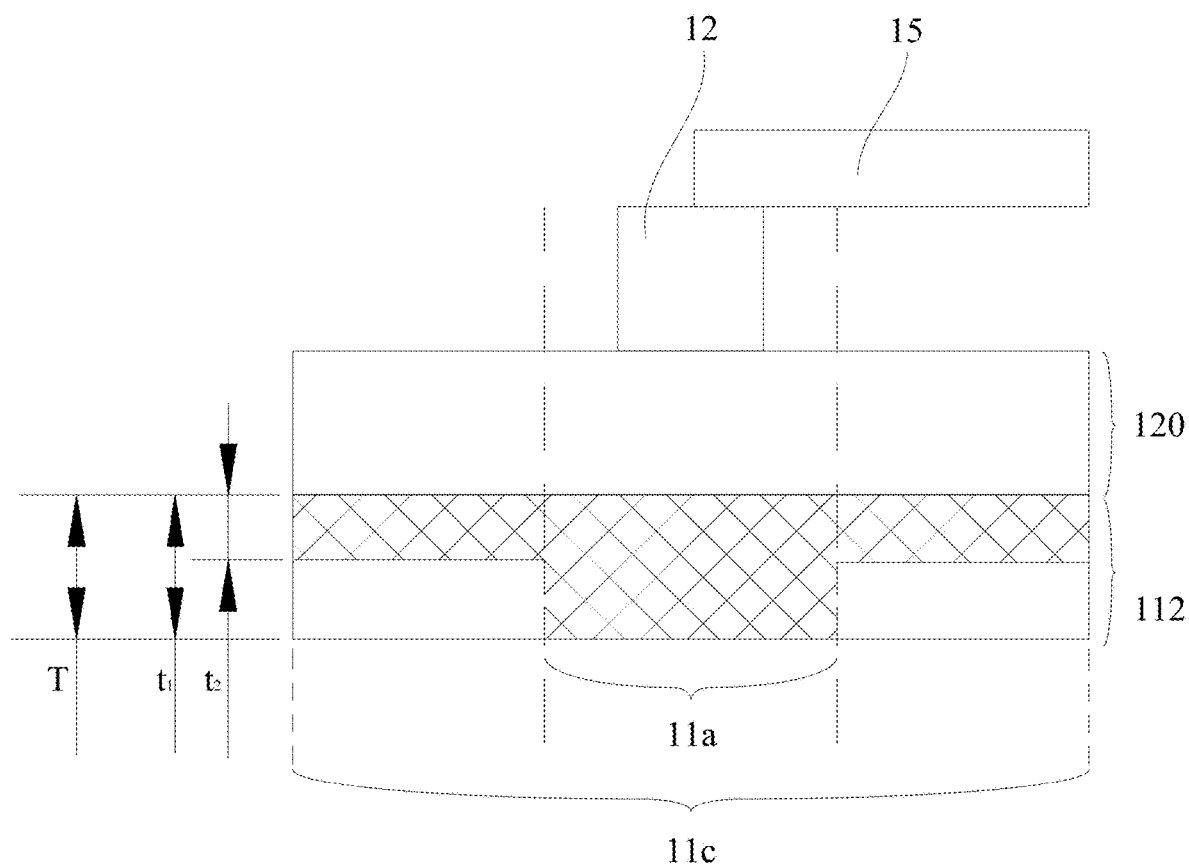
FIG. 15 is a schematic diagram of a partial cross-section of a vehicle display device according to embodiments of the present disclosure.

FIG. 15 is a schematic diagram of a partial cross-section of a vehicle display device according to embodiments of the present disclosure. The cross-section corresponds to the II-II cross-section in FIG. 9. As shown in FIG. 15, the etching depth t1 of the bending region 11a is equal to the thickness T of the support plate 112, and the etching depth t2 of the non-bending region 11b is less than the thickness T of the support plate 112.

By arranging the etching depth t1 of the bending region 11a to be larger, the bending region 11a is made easier to bend. Arranging the etching depth t2 of the non-bending region 11b smaller than the etching depth t1 of the bending region 11a makes the stiffness of the etching region in the non-bending region 11b between the stiffness of the non-etching region in the non-bending region 11b and the stiffness of the bending region 11a, which acts as a transition to avoid the formation of a larger stress at the junction of the bending region 11a and the non-bending region 11b when the vehicle display device is bent.

Optionally, the minimum etching depth of the non-bending region 11b is not less than one-fifth of the thickness of the support plate 112. The minimum etching depth of the non-bending region 11b is the etching depth within the etching region 11c where the etching depth of the non-bending region 11b is the smallest.

In the embodiment shown in FIG. 15, within the etching region 11c, the etching depths at each of the non-bending regions 11b are equal. In other embodiments, within the etching region 11c, the etching depths at each of the non-bending regions 11b are unequal.

Figure 16:
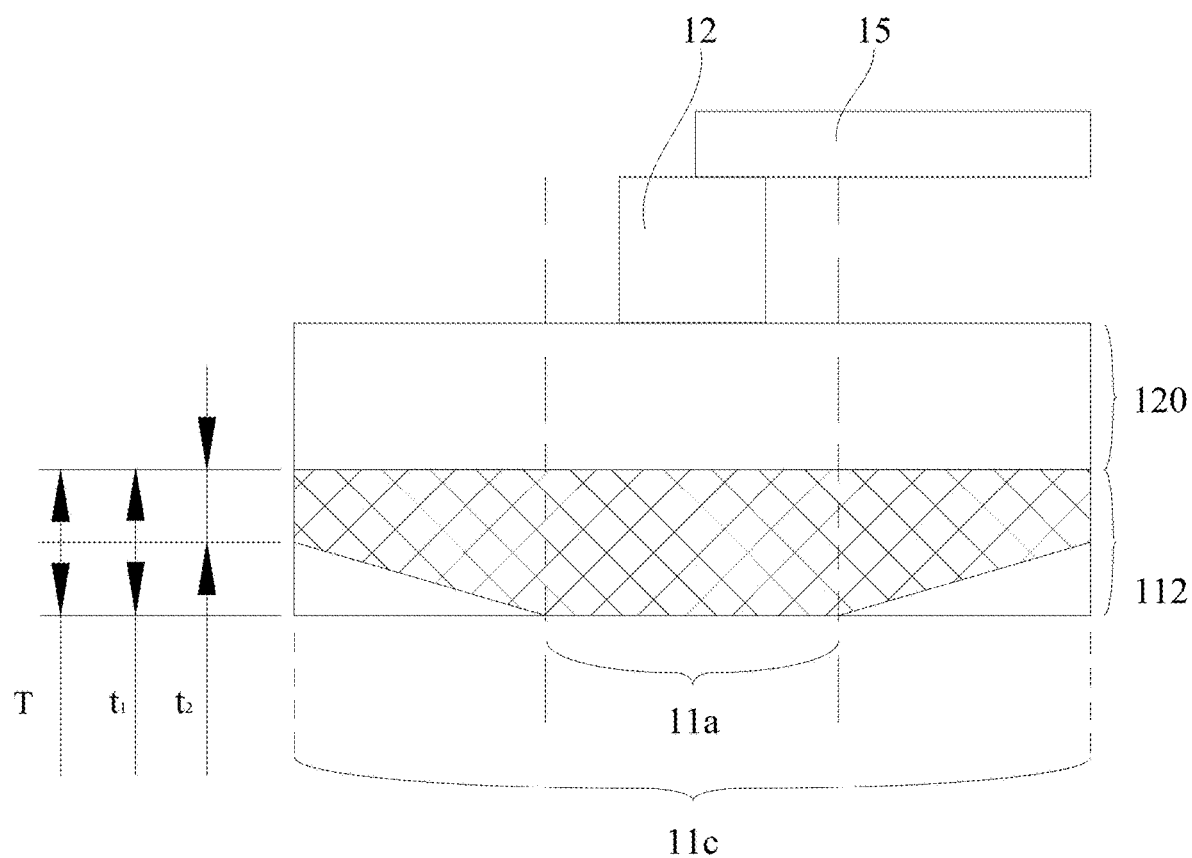
FIG. 16 is a schematic diagram of a partial cross-section of a vehicle display device according to some embodiments of the present disclosure.

For example, FIG. 16 is a schematic diagram of a partial cross-section of a vehicle display device according to some embodiments of the present disclosure. The cross-section corresponds to the II-II cross-section in FIG. 9. As shown in FIG. 16, in the embodiment, the etching depth t2 of the non-bending region 11b decreases gradually along the direction away from the bending region 11a.

In the etching region 11c, the etching depth t2 of the non-bending region 11b is set in a gradual form, which can further optimize the stress distribution in the support plate 112 based on that shown in FIG. 15, and avoid the existence of large stresses at the junction of the non-bending region 11b and the bending region 11a due to the abrupt change in the etching depth.

Figure 17:
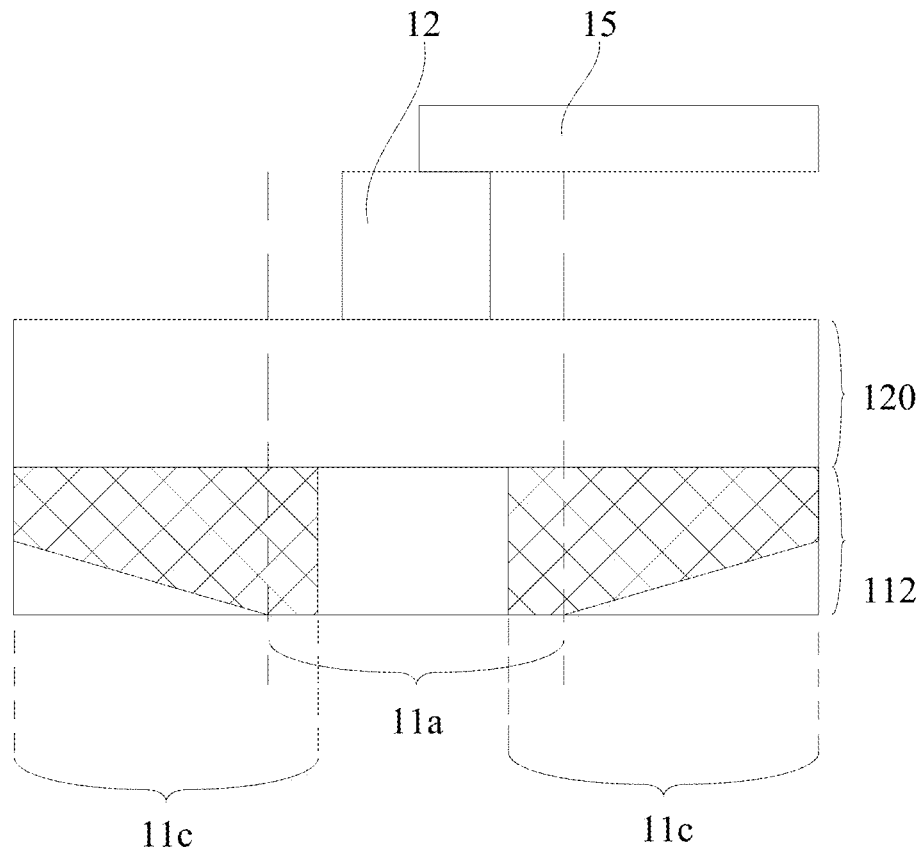
FIG. 17 is a schematic diagram of a partial cross-section of a vehicle display device according to some embodiments of the present disclosure.

FIG. 17 is a schematic diagram of a partial cross-section of a vehicle display device according to some embodiments of the present disclosure. The cross-section corresponds to the II-II cross-section in FIG. 9. As shown in FIG. 17, in the embodiment, one portion of the etching region 11c is within the bending region 11a and the portion is out of the bending region 11a. The heating structure 12 is outside of the etching region 11c.

The heating structure 12 is arranged in the bending region 11a while being out of the etching region 11c, that is, a portion of the region in the bending region 11a is not etched, the orthographic projection of the heating structure 12 on the surface of the support plate 112 is within the non-etching region in the bending region 11a, and the area of the orthographic projection of the heating structure 12 on the surface of the support plate 112 is less than or equal to the area of the non-etching region in the bending region 11a. Arranging the heating structure 12 outside the etching region 11c facilitates the heat exchange between the heating structure 12 and the flexible display panel 111 and improves the heating efficiency of the heating structure 12.

For the vehicle display device shown in FIG. 10, FIG. 14 and FIG. 15, a portion of the region in the bending region 11a is not etched and configured to arrange the heating structure 12 to facilitate heat exchange between the heating structure 12 and the flexible display panel 111.

Figure 18:
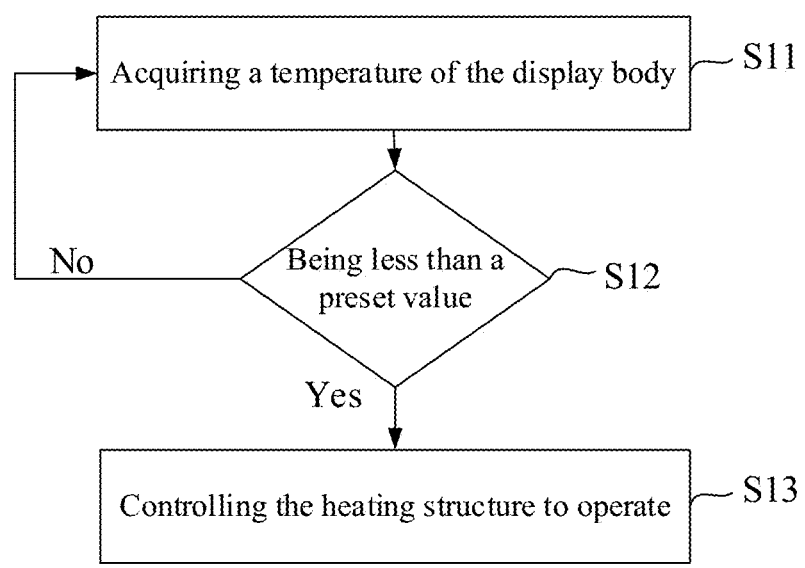
FIG. 18 is a flowchart of a method for controlling a vehicle display device according to some embodiments of the present disclosure.

FIG. 18 is a flowchart of a method for controlling a vehicle display device according to some embodiments of the present disclosure. The method is configured to control any of the vehicle display devices shown in FIGS. 1 to 17. As shown in FIG. 18, the control method includes the follows.

In step S11, a temperature of the display body 11 is acquired.

In step S12, whether the temperature of the display body 11 is lower than a preset value is determined. In response to the temperature being lower than the preset value, subsequent step S13 is performed, and in response to the temperature being not lower than the preset value, step S11 is returned, or terminated.

In step S13, the heating structure 12 is controlled to operate.

By providing a heating structure 12 on the back side of the display body 11 in the vehicle display device, the heating structure 12 is configured to heat the bending region 11a of the display body 11 to a more suitable temperature in response to the temperature being lower than a preset value, reducing the possibility of the vehicle display device being damaged in bending process. Because the vehicle display device, like other electronic devices, generates heat during operation, the temperature of the display body 11 tends to rise as the vehicle display device works in response to the temperature of the display body 11 being not lower than a preset value in step S12, the present method is chosen to be terminated to reduce power consumption.

In step S11, the temperature inside the vehicle is used as the temperature of the display body 11. The temperature inside the vehicle is measured by the temperature sensor inside the vehicle. In the case that the ambient temperature is low and the vehicle has not been started or has just been started, the temperature of the display body 11 is close to the ambient temperature because the display body 11 has not been used for a long time, and the temperature inside the vehicle is approximated as the temperature of the display body 11.

For a vehicle display device including a temperature sensor, the temperature of the display body 11 is acquired by the temperature sensor to improve the accuracy of the temperature.

For different vehicle display devices, the preset values of the temperature are the same or different. The size of the preset value is determined by testing, and the stress distributions are different when the display body 11 is bent at different temperatures, and the possibility of damage to the display body 11 is assessed based on the stress distribution. As the temperature decreases, the stress distribution gradually deteriorates, leading to a gradual increasing possibility of damage to the display body 11. The temperature corresponding to the stress distribution making the possibility of damage to the display body 11 at or above an unacceptable level can be determined as a preset value. For example, 15° C., 18° C., 20° C., etc.

In some examples, upon step S13, the method further includes the follows.

In response to the temperature of the display body 11 rising to a first threshold by heating, the heating is stopped. The heating is resumed in response the temperature dropping to a second threshold, the second threshold being lower than the first threshold, and the second threshold being greater than or equal to the above preset value.

Alternatively, in response to the temperature rising to the first threshold, the heating power of the heating structure 12 is reduced and the display body 11 is insulated, such that the temperature of the display body 11 is maintained near the first threshold.

Embodiments of the present disclosure also provide a vehicle, including one or more vehicle display devices. At least one of the vehicle display devices is any one of the vehicle display devices as shown in FIGS. 1 to 17.

As an embodiment, the arrangement of the vehicle display devices in the vehicle is referred to the above description for FIG. 1.

The above are only optional embodiments of the present disclosure and are not intended to limit the present disclosure, and any modifications, equivalent replacements, improvements, etc. made within the spirit and principles of the present disclosure shall be included within the scope of protection of the present disclosure.

What is claimed is:

1. A vehicle display device, comprising: a display body and a heating structure; wherein the display body has a bending region and a non-bending region, and the heating structure is disposed on a back side of the display body and in the bending region, wherein a front side of the display body is configured for display, and the back side is opposite to the front side, wherein the display body comprises a flexible display panel and a support plate; wherein the support plate is connected to one side of the flexible display panel, the heating structure is disposed on a side, distal from the flexible display panel, of the support plate, and the support plate has an etching region at least partially overlapped with the bending region, the bending region is within the etching region, and an etching depth of the non-bending region decreases in a direction away from the bending region.

2. The vehicle display device according to claim 1, further comprising: a temperature sensor disposed on the back side of the display body and in the non-bending region; wherein the temperature sensor is configured to detect a temperature of the display body.

3. The vehicle display device according to claim 2, further comprising: a circuit board disposed on the back side of the display body and in the non-bending region; wherein the display body, the heating structure, and the temperature sensor are electrically connected to the circuit board, and the circuit board is configured to control the heating structure to operate in response to the temperature of the display body being below a preset value.

4. The vehicle display device according to claim 3, wherein the display body has two bending regions, and the circuit board and the temperature sensor are disposed between the two bending regions.

5. The vehicle display device according to claim 1, wherein one portion of the etching region is within the bending region, the other portion of the etching region is outside the bending region, and the heating structure is outside the etching region.

6. The vehicle display device according to claim 1, wherein in the etching region, an etching depth of the bending region is not less than an etching depth of the non-bending region.

7. The vehicle display device according to claim 1, wherein a minimum etching depth of the non-bending region is not less than one fifth of a thickness of the support panel.

8. The vehicle display device according to claim 1, wherein the display body further comprises a touch layer disposed on a side, distal form the support plate, of the flexible display panel, or disposed within the flexible display panel.

9. A method for controlling a vehicle display device, applicable to a vehicle display device, wherein the vehicle display device comprises: a display body and a heating structure; wherein the display body has a bending region and a non-bending region, and the heating structure is disposed on a back side of the display body and in the bending region, wherein a front side of the display body is configured for display, and the back side is opposite to the front side, the method comprising:
  acquiring a temperature of the display body;
  controlling the heating structure to operate in response to the temperature of the display body being less than a preset value,
  wherein the display body comprises a flexible display panel and a support plate; wherein the support plate is connected to one side of the flexible display panel, the heating structure is disposed on a side, distal from the flexible display panel, of the support plate, and the support plate has an etching region at least partially overlapped with the bending region,
  the bending region is within the etching region, and
  an etching depth of the non-bending region decreases in a direction away from the bending region.

10. The method according to claim 9, wherein the vehicle display device further comprises: a temperature sensor disposed on the back side of the display body and in the non-bending region; wherein the temperature sensor is configured to detect a temperature of the display body.

11. The method according to claim 10, wherein the vehicle display device further comprises: a circuit board disposed on the back side of the display body and in the non-bending region; wherein the display body, the heating structure, and the temperature sensor are electrically connected to the circuit board, and the circuit board is configured to control the heating structure to operate in response to the temperature of the display body being below a preset value.

12. The method according to claim 11, wherein the display body has two bending regions, and the circuit board and the temperature sensor are disposed between the two bending regions.

13. The method according to claim 9, wherein the display body comprises a flexible display panel and a support plate; wherein the support plate is connected to one side of the flexible display panel, the heating structure is disposed on a side, distal from the flexible display panel, of the support plate, and the support plate has an etching region at least partially overlapped with the bending region.

14. The method according to claim 13, wherein the bending region is within the etching region.

15. The method according to claim 14, wherein in the etching region, an etching depth of the bending region is not less than an etching depth of the non-bending region.

16. The method according to claim 13, wherein one portion of the etching region is within the bending region, the other portion of the etching region is outside the bending region, and the heating structure is outside the etching region.

17. A vehicle, comprising: a vehicle display device, wherein the vehicle display device comprises: a display body and a heating structure; wherein the display body has a bending region and a non-bending region, and the heating structure is disposed on a back side of the display body and in the bending region, wherein a front side of the display body is configured for display, and the back side is opposite to the front side,
  wherein the display body comprises a flexible display panel and a support plate; wherein the support plate is connected to one side of the flexible display panel, the heating structure is disposed on a side, distal from the flexible display panel, of the support plate, and the support plate has an etching region at least partially overlapped with the bending region,
  the bending region is within the etching region, and
  an etching depth of the non-bending region decreases in a direction away from the bending region.

* * * * *